United States Patent [19]

Ooms et al.

[11] Patent Number: 5,767,543

[45] Date of Patent: Jun. 16, 1998

[54] FERROELECTRIC SEMICONDUCTOR DEVICE HAVING A LAYERED FERROELECTRIC STRUCTURE

[75] Inventors: William J. Ooms; Daniel S. Marshall, both of Chandler; Jerald A. Hallmark, Gilbert, all of Ariz.

[73] Assignee: Motorola, Inc., Schaumburg, Ill.

[21] Appl. No.: 714,715

[22] Filed: Sep. 16, 1996

[51] Int. Cl.$^6$ .......................... H01L 29/788; G11C 11/22

[52] U.S. Cl. .......................... 257/315; 257/316; 257/317; 257/318; 365/145

[58] Field of Search .................... 257/315, 316, 257/317, 318; 365/145; 437/235

[56] References Cited

U.S. PATENT DOCUMENTS

| | | | |
|---|---|---|---|
| 2,791,760 | 5/1957 | Ross | 340/173 |
| 4,873,664 | 10/1989 | Eaton, Jr. | 365/145 |
| 5,070,026 | 12/1991 | Greenwald et al. | 437/3 |
| 5,146,299 | 9/1992 | Lampe et al. | 257/355 |
| 5,225,031 | 7/1993 | McKee et al. | 156/612 |
| 5,423,285 | 6/1995 | Paz de Araujo et al. | 117/90 |
| 5,426,075 | 6/1995 | Perino et al. | 437/235 |
| 5,434,102 | 7/1995 | Watanabe et al. | 437/130 |
| 5,439,845 | 8/1995 | Watanabe et al. | 437/130 |
| 5,450,812 | 9/1995 | McKee et al. | 117/84 |
| 5,468,679 | 11/1995 | Paz de Araujo et al. | 437/110 |
| 5,468,684 | 11/1995 | Yoshimori et al. | 437/228 |
| 5,471,363 | 11/1995 | Mihara | 361/305 |
| 5,481,490 | 1/1996 | Watanabe et al. | 365/145 |
| 5,482,003 | 1/1996 | McKee et al. | 117/108 |
| 5,519,234 | 5/1996 | Paz de Araujo et al. | 257/295 |
| 5,579,258 | 11/1996 | Adachi | 365/145 |

OTHER PUBLICATIONS

"Piezoelectric Ceramics" Bernard Jaffe, William Cook, Jr. and Hans Jaffe, Academic Press, London and New York, 1971, pp. 213–235.

"Crystal Structure of $Bi_4Ti_3O_{12}$", J. F. Dorrian, R. E. Newnham, D. K. Smith and M. I. Kay, Ferroelectronics, Gordon and Breach Science Publishers Ltd., Norwich, England, 1971, vol. 3, pp. 17–27.

*Primary Examiner*—Carl W. Whitehead
*Attorney, Agent, or Firm*—Rennie William Dover

[57] ABSTRACT

A layered bismuth ferroelectric structure (12) and a method for forming the bismuth layered ferroelectric structure (12). A monolayer (12A) of bismuth is formed in intimate contact with a single crystalline semiconductor material (11). A layered ferroelectric material (12) is grown on the monolayer (12A) of bismuth such that the monolayer (12A) of bismuth becomes a part of the layered ferroelectric material (12). The ferroelectric material (12) forms a layered ferroelectric material which is not a pure perovskite, wherein the crystalline structure at the interface between the single crystalline semiconductor material (11) and the monolayer (12A) of bismuth are substantially the same.

11 Claims, 3 Drawing Sheets

5,767,543

FERROELECTRIC SEMICONDUCTOR DEVICE HAVING A LAYERED FERROELECTRIC STRUCTURE

BACKGROUND OF THE INVENTION

The present invention relates, in general, to semiconductor devices, and more particularly, to ferroelectric semiconductor devices.

Ferroelectric materials have been used to form electrical components such as capacitors, non-volatile memories, and optical guided wave devices. Typically, these materials are deposited on a conductive substrate which is disposed on a substrate oxide overlying a semiconductor substrate. The substrate oxide prevents defects that might occur at the interface between the silicon substrate and the ferroelectric material, which defects degrade the performance of the semiconductor device. Further, the ferroelectric material is typically deposited as a polycrystalline film. Accordingly, the ferroelectric material generally has poor leakage characteristics. Moreover, the interface between a ferroelectric material deposited directly on a semiconductor substrate and the semiconductor substrate has generally been unsuitable for semiconductor device applications.

Techniques for depositing the ferroelectric material include sputter deposition using a single target, sputter co-deposition using two or more targets, and spin-on deposition. The use of sputtering techniques to deposit ferroelectric material directly on a semiconductor substrate damages the semiconductor substrate, thereby creating interface states. Spin-on deposition, on the other hand, is performed in atmospheric conditions and results in a large interface state density due to poor interface control. In addition, these techniques require a high temperature anneal, e.g., about 900 degrees Celsius (° C.), which adversely affects the semiconductor substrate and thus the interface between the ferroelectric film and the semiconductor substrate. Other drawbacks of the spin-on deposition technique include incompatibility with standard integrated circuit processes, precipitation of particles in the ferroelectric materials during their deposition, and poor adhesion of the ferroelectric material to the semiconductor substrate.

Accordingly, it would be advantageous to have a ferroelectric device and a method for manufacturing the ferroelectric device wherein the ferroelectric material is lattice matched to a semiconductor surface to minimize defects at the ferroelectric-semiconductor interface due to strain. It would be of further advantage to deposit a ferroelectric film having properties that are suitable for use in a ferroelectric gate field effect transistor. Suitable properties of the ferroelectric film include a low interface state density, appropriate spontaneous polarization, and an appropriate coercive field.

DETAILED DESCRIPTION OF THE DRAWINGS

Generally, the present invention provides a terminating layer on a semiconductor that results in low stress and a low interface state density. Furthermore, the present invention provides a ferroelectric device and a method for manufacturing the ferroelectric device. In accordance with the present invention, an epitaxial layer of ferroelectric material is formed on a semiconductor substrate using techniques such as molecular beam epitaxy (MBE), chemical beam epitaxy (CBE), metallo-organic chemical vapor deposition (MOCVD), or combinations thereof, creating a layered structure. In order to achieve a low interface state density, the growth technique must control the environment of the substrate so that it can be made atomically clean and kept atomically clean. Thus, the present invention provides a deposition process in which the deposition at the surface is well controlled. An advantage of epitaxially forming the interface layer is that the epitaxial layer can be substantially lattice matched to the silicon substrate and thus has a low defect density with substantially no dislocations formed in the crystalline structure.

Figure 1:
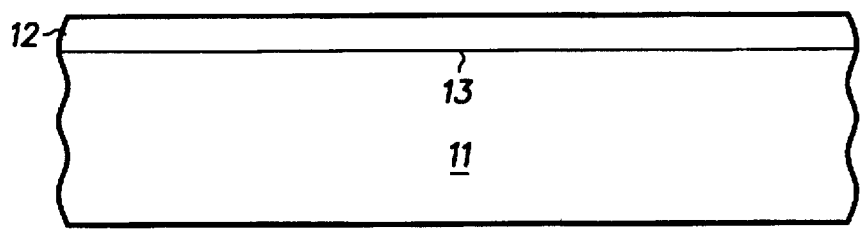
FIG. 1 is a cross-sectional view of a portion of a ferroelectric semiconductor device at an early stage of manufacture in accordance with the present invention.

FIG. 1 is a cross-sectional view of a portion of a ferroelectric semiconductor device 10 at an early stage of manufacture in accordance with the present invention. Ferroelectric semiconductor device 10 includes a monocrystalline semiconductor material or substrate 11 having a major surface 13 with a ferroelectric material 12 formed thereon. Suitable semiconductor materials for substrate 11 include silicon, gallium arsenide, indium phosphide, or the like. By way of example, semiconductor substrate 11 is silicon having a <001>surface orientation. Ferroelectric film 12 is epitaxially formed on semiconductor substrate 11 using an ultra high vacuum deposition system such as, for example, molecular beam epitaxy or chemical beam epitaxy, or a low pressure metallo-organic chemical vapor deposition system.

The use of an ultra high vacuum deposition system is a means of preventing undesired elements from destroying the electronic properties at the interface between silicon substrate 11 and layered ferroelectric film 12. In accordance with one aspect of the present invention, a monocrystalline layer of ferroelectric material is formed in intimate contact with the semiconductor substrate. Further, the ferroelectric material has a lattice constant substantially matching that of semiconductor substrate 11. The method of the present invention prevents undesired material such as, for example, an undesired oxide or contaminants from appearing at the interface between the ferroelectric film and the semiconductor substrate.

Figure 2:
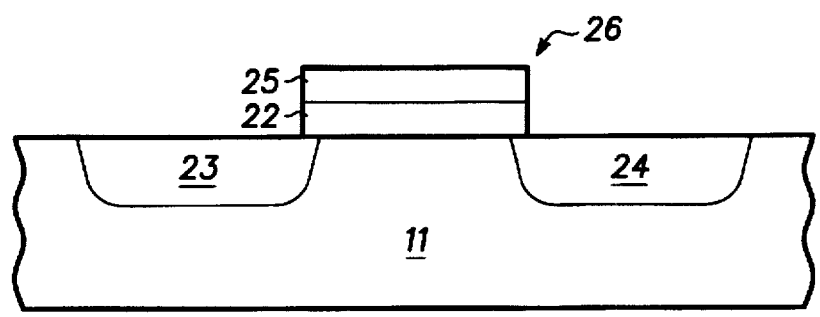
FIG. 2 is a cross-sectional view of the semiconductor device of FIG. 1 further along in processing.

FIG. 2 is a cross-sectional view of ferroelectric semiconductor device 10 further along in processing. A layer 25 of conductive material is formed on ferroelectric film 12 (shown in FIG. 1). An etch mask (not shown) such as, for example, photoresist, is formed on a portion of layer 25 of conductive material. The portions of layer 25 of conductive material and ferroelectric film 12 unprotected by the etch mask are removed by, for example, a reactive ion etch, forming a ferroelectric gate structure 26. Ferroelectric gate structure 26 is comprised of layer 25 and ferroelectric gate dielectric 22 which is the remaining portion of ferroelectric material 12. Thus, the remaining portion of layer 25 serves as a gate electrode. The remaining portions of the layer of photoresist are removed.

An impurity material of N conductivity type such as, for example, phosphorus is implanted into the portions of silicon substrate 11 adjacent to ferroelectric gate dielectric 22 to form doped regions 23 and 24. Doped regions 23 and 24 serve as source and drain regions, respectively, of ferroelectric semiconductor device 10. Techniques for applying and removing photoresist, etching a ferroelectric film, and implanting an impurity material are well known to those skilled in the art. Although not shown, gate contacts, source contacts, and drain contacts may be formed to contact gate electrode 26, source region 23, and drain region 24, respectively. It should be noted the present invention is suitable for forming N and P channel enhancement mode field effect transistors and N and P channel depletion mode field effect transistors. Thus, the source/drain regions can be formed using an impurity material of P conductivity type such as, for example, boron.

Figure 3:
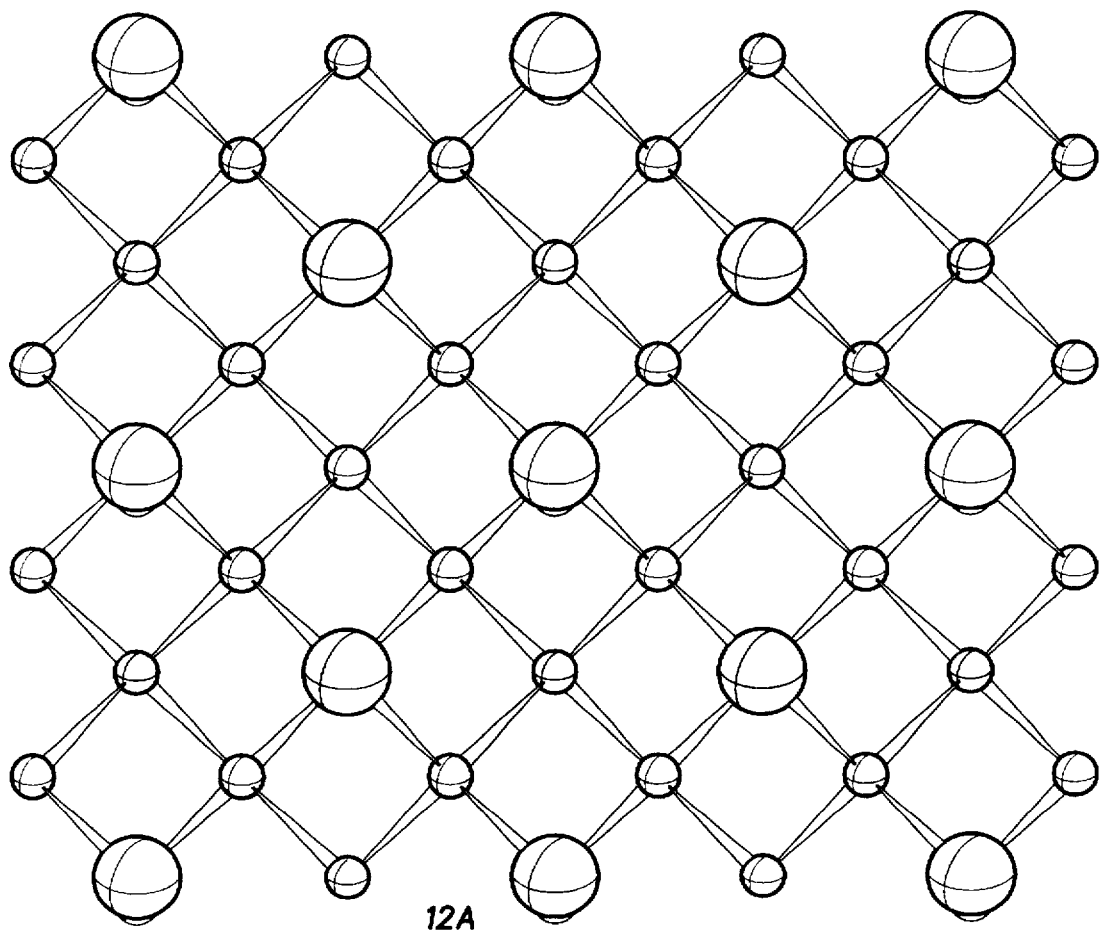
FIG. 3 is a top view of a monolayer of a metal film formed in accordance with the present invention.

FIG. 3 illustrates a top view of a monolayer 12A of a metal element in accordance with the present invention. Monolayer 12A is also referred to as a precursor layer, an initial layer, or an interface layer. It should be noted that the letter "A" has been appended to the reference number 12 to illustrate that layer 12A is one layer of layered ferroelectric film 12 shown in FIG. 1. Because FIG. 3 is a top view of a crystalline structure, layers of silicon below monolayer 12A are also shown. It should be further noted that the same reference numbers are used in the figures to denote the same elements. Monolayer 12A is an epitaxial metal layer comprised of a monolayer of a metal element, excluding tantalum (Ta) when substrate 11 is silicon, having a maximum solid solubility limit of less than or equal to $1 \times 10^{19}$ atoms per cubic centimeter (atoms/cm$^3$). Examples of suitable elements for monolayer 12A on silicon include bismuth (Bi), tellurium (Te), lead (Pb), thallium (Tl), or combinations thereof. Bismuth, for example has a solid solubility of approximately $1 \times 10^{18}$ atoms/cm$^3$ in silicon.

A key feature of these elements is that they fill dangling bonds extending from the monocrystalline lattice of the semiconductor material, e.g., dangling bonds extending from silicon. A low solid solubility is important because these materials do not react strongly with the bulk of the semiconductor material. Forming layers that react strongly with the bulk of the semiconductor material can result in the uncontrolled formation of unwanted compounds, e.g., metal silicides for a silicon-metal system. By using materials with a limited solid solubility, metal layers can be deposited without making unwanted compounds. Also, single monolayers of these metals can be deposited in a selflimiting fashion. In other words, more than a monolayer may be deposited with the excess not being able to stick to the surface within specified processing conditions such as, for example, a specified temperature range. The self-limiting aspect of the present invention provides a manufacturable interface. Accordingly, a monolayer 12A of bismuth is an initial layer which is part of a layered ferroelectric material described with reference to FIG. 4.

Figure 4:
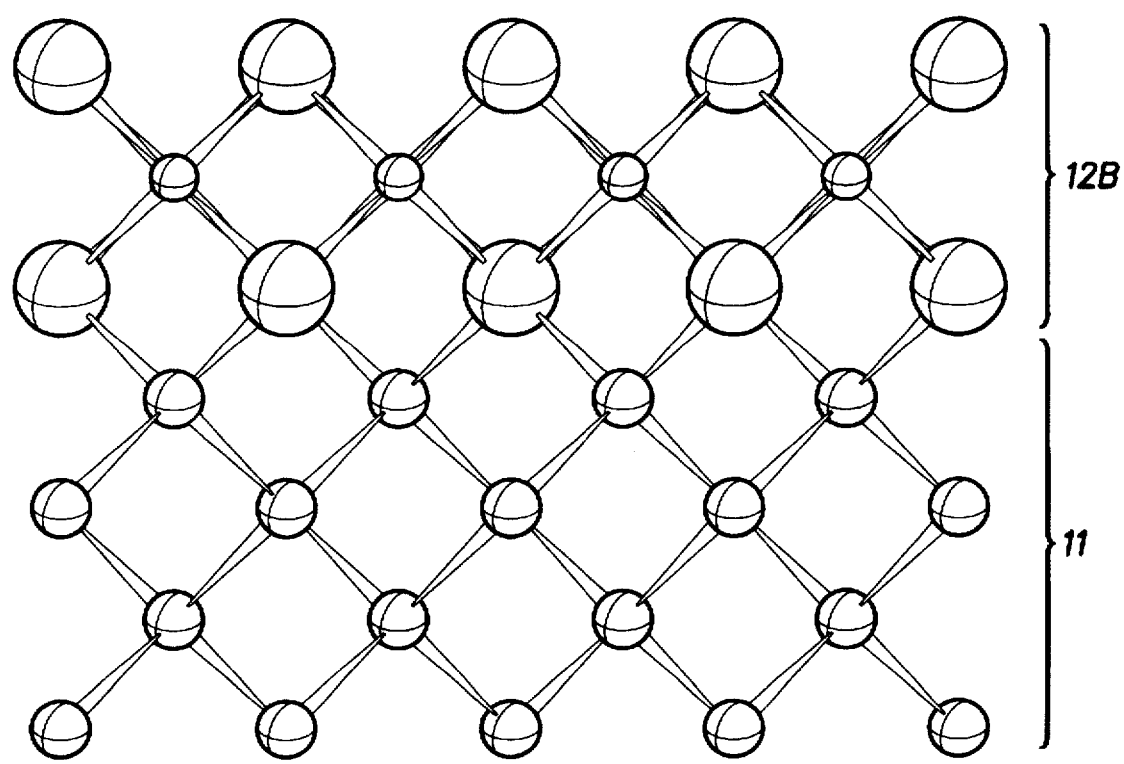
FIG. 4 is a cross-sectional view of a metal oxide film in accordance with the present invention.

FIG. 4 is cross-sectional view of another precursor layer 12B formed on a single crystal silicon substrate in accordance with the present invention. It should be noted that the letter "B" has been appended to reference number 12 to illustrate that layer 12B is one portion of the embodiment of layered ferroelectric film 12 shown in FIG. 1. It should be further noted that precursor layer 12B can be viewed as a single layer formed on monolayer 12A or, alternatively, it can be viewed as a single layer that includes monolayer 12A. Precursor layer 12B is cubic $Bi_2O_2$ which is epitaxially grown on silicon substrate 11. Cubic $Bi_2O_2$ is also referred to as cubic BiO because they are stoichiometrically equivalent. Thus, cubic $Bi_2O_2$ is in intimate contact with the single crystal material of substrate 11. It should be understood that cubic $Bi_2O_2$ is different from bismuth oxide ($Bi_2O_3$) because it is not a stable compound in bulk form. In other words, cubic $Bi_2O_2$ forms a metastable layer that ceases to grow beyond a finite thickness. Typically, the number of layers of cubic $Bi_2O_2$ in cubic $Bi_2O_2$ layer 12B ranges from one to three. Another difference between bismuth oxide ($Bi_2O_3$) and $Bi_2O_2$ is that bismuth oxide ($Bi_2O_3$) is a hexagonal structure whereas $Bi_2O_2$ is a cubic structure.

Figure 5:
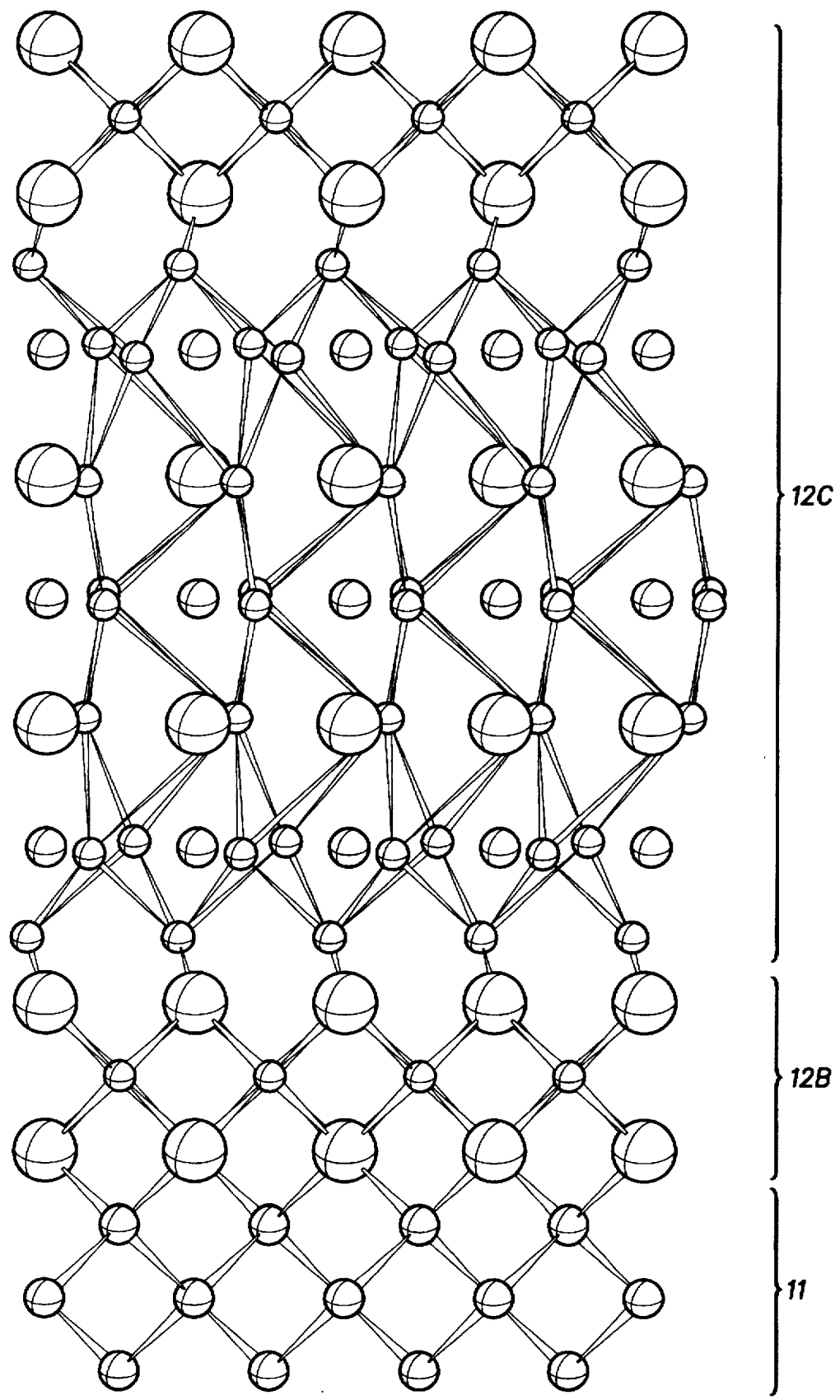
FIG. 5 is a cross-sectional view of a ferroelectric film in accordance with the present invention.

FIG. 5 is a cross-sectional view of a layered epitaxial ferroelectric film 12C formed on cubic $Bi_2O_2$ layer 12B in accordance with the present invention. It should be noted that the letter "C" has been appended to the reference number 12 to illustrate that layer 12C is another portion of the embodiment of layered ferroelectric film 12 shown in FIG. 1. It should be further noted that the same reference numbers are used in the figures to denote the same elements. By way of example, ferroelectric layer 12C is a layered $Bi_4Ti_3O_{12}$ structure.

In accordance with the present embodiment, the combination of layers of cubic $Bi_2O_2$ and $Bi_2Ti_3O_{10}$ form bismuth titanate ($Bi_4Ti_3O_{12}$). The average lattice constant of this material is 0.5430 nanometers (nm) which is essentially the same as the lattice constant of crystalline silicon, i.e., 0.543095 nm. A unit cell of bismuth ($Bi_4Ti_3O_{12}$) is stoichiometrically completed when the $Bi_2Ti_3O_{10}$ is deposited on the cubic $Bi_2O_2$.

Although one embodiment of the present invention has been described as showing a layer of bismuth titanate formed on the semiconductor substrate, this is not a limitation of the present invention. Other suitable ferroelectric films include bismuth layered ferroelectrics such as, for example, strontium bismuth tantalate ($Bi_2SrTa_3O_9$), and bismuth titanium niobate ($Bi_3TiNbO_9$).

By now it should be appreciated that a ferroelectric film having a layered bismuth ferroelectric structure and a semiconductor device that includes the layered ferroelectric structure have been provided. The ferroelectric film is a layered epitaxial film that is formed using an ultra high vacuum deposition system such as molecular beam epitaxy or chemical beam epitaxy or a low pressure metallo-organic chemical vapor deposition system. Formation of ferroelectric epitaxial films in accordance with the present invention decreases the number of interface states and provides lattice matching between a semiconductor layer and the ferroelectric film. Further, the epitaxial layer of ferroelectric material has an atomic spacing which is commensurate with the monocrystalline semiconductor substrate. One may also deposit or grow a film with a somewhat larger or smaller lattice constant than that of the substrate on which the film is grown. The lattice constant of the film can be forced to be commensurate with that of the substrate while under strained conditions by keeping the grown film less than the critical thickness. Other features of the present invention are that it provides a ferroelectric film and method for fabricating the layered ferroelectric film without a pure perovskite structure, and the present invention provides a low interface state density, appropriate spontaneous polarization, and an appropriate coercive field.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention. For example, FIGS. 3–5 illustrate the assumed positions of the bismuth atoms relative to the silicon surface atoms. Present analytical techniques do not allow precise determination of the exact position of the atoms. Thus, FIGS. 3–5 provide an illustration of the present invention; however, deviations from the assumed atomic positions do not detract from spirit and scope of the invention.

We claim:

1. A layered bismuth ferroelectric structure, comprising:

a monocrystalline semiconductor substrate; and an epitaxial layer of ferroelectric material comprising bismuth (Bi) disposed on the monocrystalline semiconductor substrate, wherein the epitaxial layer of ferroelectric material has substantially a same atomic spacing as the monocrystalline semiconductor substrate, comprises a layer of $Bi_2O_2$ in intimate contact with the monocrystalline semiconductor substrate, and is between the monocrystalline semiconductor substrate and at least one layer of bismuth titanate $(Bi_4Ti_3O_{12})$.

2. The layered bismuth ferroelectric structure of claim 1, further including a monolayer of bismuth in intimate contact with the monocrystalline semiconductor substrate.

3. A ferroelectric semiconductor device, comprising:

a semiconductor material of a first conductivity type and having a major surface, the semiconductor material being monocrystalline;

an epitaxial layer disposed over the major surface, the epitaxial layer comprising an oxide of thallium (Tl), bismuth (Bi), lead (Pb), or tellurium (Te);

an epitaxial ferroelectric layer disposed over the epitaxial layer, wherein the epitaxial ferroelectric layer has first and second edges;

a gate electrode disposed over the epitaxial ferroelectric layer;

a first doped region adjacent the first edge of the epitaxial ferroelectric layer; and a second doped region adjacent the second edge of the epitaxial ferroelectric layer.

4. The ferroelectric semiconductor device of claim 3, wherein the epitaxial metal layer includes a bismuth (Bi) layered ferroelectric.

5. The ferroelectric semiconductor device of claim 4, wherein the epitaxial metal layer further includes a ferroelectric material selected from the group consisting of bismuth titanate $(Bi_4Ti_3O_{12})$, strontium bismuth tantalate $(Bi_2SrTa_3O_9)$, and bismuth titanium niobate $(Bi_3TiNbO_9)$.

6. The ferroelectric semiconductor device of claim 3, wherein the epitaxial metal layer further includes a bismuth layered ferroelectric having at least one layer of $Bi_2O_2$ between the at least one layer of bismuth layered ferroelectric and the semiconductor material.

7. The ferroelectric semiconductor device of claim 6, wherein the epitaxial ferroelectric layer further includes a ferroelectric material selected from the group consisting of bismuth titanate $(Bi_4Ti_3O_{12})$, strontium bismuth tantalate $(Bi_2SrTa_3O_9)$, and bismuth titanium niobate $(Bi_3TiNbO_9)$.

8. The ferroelectric semiconductor device of claim 13, wherein the first and second doped regions are of a second conductivity type.

9. A layered bismuth ferroelectric structure, comprising:

a monocrystalline semiconductor substrate; and an epitaxial layer of ferroelectric material comprising bismuth (Bi) disposed on the monocrystalline semiconductor substrate, wherein the epitaxial layer of ferroelectric material has substantially a same atomic spacing as the monocrystalline semiconductor substrate, comprises a layer of $Bi_2O_2$ in intimate contact with the monocrystalline semiconductor substrate, and is between the monocrystalline semiconductor substrate and another layer of ferroelectric material.

10. The layered bismuth ferroelectric structure of claim 9, wherein the another layer of ferroelectric material comprises at least one layer of bismuth titanate $(Bi_4Ti_3O_{12})$.

11. The layer bismuth ferroelectric structure of claim 9, further including a monolayer of bismuth in intimate contact with the monocrystalline semiconductor substrate.

* * * * *

UNITED STATES PATENT AND TRADEMARK OFFICE
CERTIFICATE OF CORRECTION

PATENT NO. : 5,767,543
DATED : June 16, 1998
INVENTOR(S) : William J. Ooms et al.

It is certified that error appears in the above-identified patent and that said Letters Patent is hereby corrected as shown below:

In column 5, claim 1, line 12, delete "($Bi_4Ti_3O_{12)}$." and insert --($Bi_4Ti_3O_{12}$).-- therefor.

In column 5, claim 4, line 35, delete "metal".

In column 5, claim 5, line 37, delete "metal".

In column 6, claim 5, line 3, delete "($Bi_3TiNbO_{9)}$." and insert --($Bi_3TiNbO_9$).-- therefor.

In column 6, claim 6, line 5, delete "metal".

In column 6, claim 7, line 14, delete "($Bi_3TiNbO_{9)}$." and insert --($Bi_3TiNbO_9$).-- therefor.

In column 6, claim 8, line 14, delete "13" and insert --3--.

In column 6, claim 10, line 32, delete "($Bi_4Ti_3O_{12)}$." and insert --($Bi_4Ti_3O_{12}$).-- therefor.

Signed and Sealed this

Second Day of March, 1999

*Attest:*

Q. TODD DICKINSON

*Attesting Officer*     *Acting Commissioner of Patents and Trademarks*